(12) United States Patent
Tachibana

(10) Patent No.: US 6,660,101 B1
(45) Date of Patent: Dec. 9, 2003

(54) METHOD AND APPARATUS FOR CLEANING FILM DEPOSITION DEVICE

(75) Inventor: Mitsuhiro Tachibana, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/070,746

(22) PCT Filed: Aug. 24, 2000

(86) PCT No.: PCT/JP00/05698

§ 371 (c)(1),
(2), (4) Date: Mar. 11, 2002

(87) PCT Pub. No.: WO01/20652

PCT Pub. Date: Mar. 22, 2001

(30) Foreign Application Priority Data

Sep. 9, 1999 (JP) ............................................ 11-256408

(51) Int. Cl.[7] ................................................ B08B 7/04
(52) U.S. Cl. .................... 134/18; 134/21; 134/22.1; 134/22.18; 134/902; 216/59; 216/61; 216/79; 156/345
(58) Field of Search ............................ 134/18, 21, 1.1, 134/22.1, 902, 22.18; 216/59, 61, 79; 156/345

(56) References Cited

U.S. PATENT DOCUMENTS

| | | | | |
|---|---|---|---|---|
| 5,902,403 A | * | 5/1999 | Aitani et al. ................. | 118/723 |
| 6,079,426 A | * | 6/2000 | Subrahmanyam et al. ... | 134/1.1 |

FOREIGN PATENT DOCUMENTS

| | | |
|---|---|---|
| JP | 9-82645 | 3/1997 |
| JP | 9-143742 | 6/1997 |
| JP | 9-293710 | 11/1997 |
| JP | 11-74258 | 3/1999 |
| JP | 11-131267 | 5/1999 |

OTHER PUBLICATIONS

International Search Report—Form PCT/ISA/210 for PCT/JP00/05698.
PCT Notification of Transmittal of Copies of Translation of the International Preliminary Examination Report (PCT/IB/338) issued for PCT/JP00/05698.
International Preliminary Examination Report (PCT/IPEA/409) (translated) issued for PCT/JP00/05698.

* cited by examiner

Primary Examiner—Zeinab El-Arini
(74) Attorney, Agent, or Firm—Smith, Gambrell & Russell, LLP

(57) ABSTRACT

This cleaning method and cleaning apparatus for a film deposition apparatus includes a processing container 4 accommodating a mounting table 10 for mounting an object W to be processed, a gas-introduction unit 52 for introducing a designated gas into the processing container, a vacuum exhausting system 36 for exhausting an atmosphere in the processing container in vacuum, and an automatic pressure regulating valve 42 interposed in the vacuum exhausting system so that a pressure in the processing container can be maintained at a constant value by changing an opening degree of the automatic pressure regulating valve. The cleaning method and cleaning apparatus further includes a cleaning-gas supplying unit 62 for supplying the gas-introduction unit with a cleaning gas, a valve-opening monitoring unit 64 for monitoring an opening degree of the automatic pressure regulating valve, a change detecting unit 66 for detecting a change in the opening degree on a basis of an output from the valve-opening monitoring unit 64 and a cleaning-end recognizing unit 68 for recognizing an end point of cleaning on a basis of an output from the change detecting unit 66. Consequently, the cleaning method and cleaning apparatus can detect the end point of an appropriate etching with ease.

9 Claims, 3 Drawing Sheets

FIG. I

METHOD AND APPARATUS FOR CLEANING FILM DEPOSITION DEVICE

This is a national stage application of PCT/JP00/05698, filed Aug. 24, 2000.

TECHNICAL FIELD

The present invention relates to cleaning method and apparatus for cleaning a film deposition apparatus that performs a film deposition process upon a semiconductor wafer or the like.

BACKGROUND OF ART

Generally, in the manufacturing process of a semiconductor integrated circuit, various kinds of processes, for example, film deposition process, oxidation/diffusion process, etching process, surface modification process, etc. are repeatedly performed upon a surface of a semiconductor wafer as an object to be processed. Then, as occasion demands, a cleaning process for removal of an unnecessary film adhering to the interior of a processing container forming a processing apparatus is performed to prevent an occurrence of particles that might cause a yield rate for production to be reduced. Especially in the film deposition process, since there are produced metal films of various elements, for example, W, WSi, Ti, TiN, etc. in addition to a proper polysilicon film, an etching process effective to these metal films is desired eagerly.

In the above-mentioned cleaning method, there exist a known plasma cleaning method where a cleaning gas is activated by using a plasma and another thermal cleaning method where a plasma is not employed but a cleaning gas is introduced into a heated processing container. In the plasma cleaning method, it is general that NF type gas (e.g. $NF_3$ gas) or HF type gas (e.g. HF gas) is employed as the cleaning gas because it is relatively difficult for only heat to resolve these gases. While, in the thermal cleaning method, CIF type gas, such as $CIF_3$, is mainly used for the cleaning gas because the same gas exhibits a high resolvability and can be resolved by only heat with ease. In the plasma cleaning method, there are drawbacks that the method requires a plasma generating mechanism and cannot clean anything besides an area where a plasma is generated. To the contrary, because of the absence of such drawbacks, the thermal cleaning method is apt to be employed frequently.

Taking it for granted that all of unnecessary supplementary films should be eliminated by a cleaning process, one of the most important things in common with both of the above mentioned cleaning methods is to carry out an etching process with a necessary and sufficient period while considering that the etching process does not injure various kinds of structures in the processing container. Namely, it means that an excessive etching should be avoided with determination of an optimum end point in the etching process. On the contrary, if performing the etching process excessively, then result in the waste of expensive cleaning gas and reduce operating time of the apparatus.

Referring to the detection for the "etching" end point in the conventional cleaning method, if the processing container is provided with an observation window, then an operator used to confirm the cleaning condition by visually confirming the interior of the processing container through the observation window thereby to determined the etching end point. Besides, as shown in Japanese Patent Publications Nos. 9-82645 and 9-143742, pressure detecting means is provided for monitoring a pressure inside the processing cointainer, so that the etching end point is determined on basis of a change in pressure.

When monitoring a pressure in the above way, however, a problem arises in that the apparatus has to be provided with the pressure detecting means additionally. While, in case of visual confirmation through the observation window, a problem arises in the existence of differences among individuals in detecting the etching end point. To begin with, if no observation window is provided for the apparatus, it is impossible to apply the above detecting method by means of the observation window.

Besides, in conformity with one's experience, it has been attempted to establish a cleaning period in accordance with an integrated time throughout the film deposition process. Nevertheless, it should be noted that the film-deposition rate differs from one processing condition to another. Furthermore, a quantity of deposited film differs from one component in the processing container to another. For these reasons, it is difficult to determine an appropriate cleaning period uniformly.

Paying attention to the above-mentioned problems, the present invention is provided to solve these problems effectively. The object of the present invention is to provide cleaning method and apparatus for a film deposition apparatus, both of which allow a proper end point of etching to be detected with ease.

DISCLOSURE OF THE INVENTION

As a result of studying the cleaning process diligently, the present invention is produced on the ground of our knowledge that if an unnecessary film to be cleaned is eliminated by the cleaning operation under a constant process, then an amount of gas resulting from the resolving reaction is decreased, so that the opening degree of an automatic pressure regulating valve is reduced as much.

The present invention resides in a cleaning method of eliminating an unnecessary film adhering to the interior of a processing container of a film deposition apparatus by using a cleaning gas, the processing container being capable of forming a vacuum by a vacuum exhausting system, the method comprising the steps of: introducing the cleaning gas of a predetermined quantity into the processing container and also controlling an opening degree of an automatic pressure regulating valve provided in the vacuum exhausting system thereby to maintain the interior of the processing container at a predetermined pressure and monitoring the opening degree of the automatic pressure regulating valve; and also detecting a situation that the opening degree has changed from an opening degree of the automatic pressure regulating valve in its stable condition in excess of a predetermined amount thereby to recognize an end point of an etching on a basis of detection of the situation.

In this way, by performing the cleaning operation so that the automatic pressure regulating valve usually attains a constant pressure in the processing container, when an unnecessary film to be eliminated in the cleaning operation vanishes, a gas produced by the resolving reaction decreases, so that the pressure in the processing container is apt to drop as much. Consequently, this change of the pressure in the processing container causes an opening degree of the automatic pressure regulating valve to be decreased in order to cancel the above change, so that the pressure in the processing container is maintained to a generally-constant value finally. Therefore, by monitoring the opening degree of the automatic pressure regulating valve, it becomes possible to recognize the appropriate end point of etching when it is detected that the opening degree has decreased more than the predetermined amount.

In this case, the end point of the etching may be identical to a point of time when it is detected that the opening degree has changed more than the predetermined amount. Alternatively, as prescribed, the end point of the etching may be identical to a point of time when a predetermined period has passed since a point of time when it was detected that the opening degree had changed more than the predetermined amount.

As prescribed for example, the predetermined period is within a range from 10 to 30% of a period from a start point of the etching till the point of time when it is detected that the opening degree has changed more than the predetermined amount.

Further, as prescribed for example, the monitoring step of the opening degree is accomplished by motoring a control voltage for driving the automatic pressure regulating valve.

Further, as prescribed for example, the cleaning gas is identical to a ClF-gas and the etching is identical to a thermal cleaning using no plasma.

The present invention as claimed resides in an apparatus for carrying out the method prescribed, the apparatus comprising a processing container in which a mounting table for mounting an object to be processed thereon is accommodated, a cleaning-gas supplying means for supplying a cleaning gas into the processing container, a vacuum exhausting system for exhausting an atmosphere in the processing container in vacuum, an automatic pressure regulating valve interposed in the vacuum exhausting system so that a pressure in the processing container can be maintained at a constant pressure by changing an opening degree of the automatic pressure regulating valve, a valve-opening monitoring means for monitoring the opening degree of the automatic pressure regulating valve, a change detecting means for detecting a change in the opening degree on a basis of an output from the valve-opening monitoring means and a cleaning-end-point recognizing means for recognizing an end point of a cleaning operation on a basis of an output from the change detecting means.

BEST MODE FOR CARRYING OUT THE INVENTION

With reference to attached drawings, we describe one embodiment of the cleaning method and the cleaning apparatus for a film deposition apparatus of the present invention, as follows.

Figure 1:
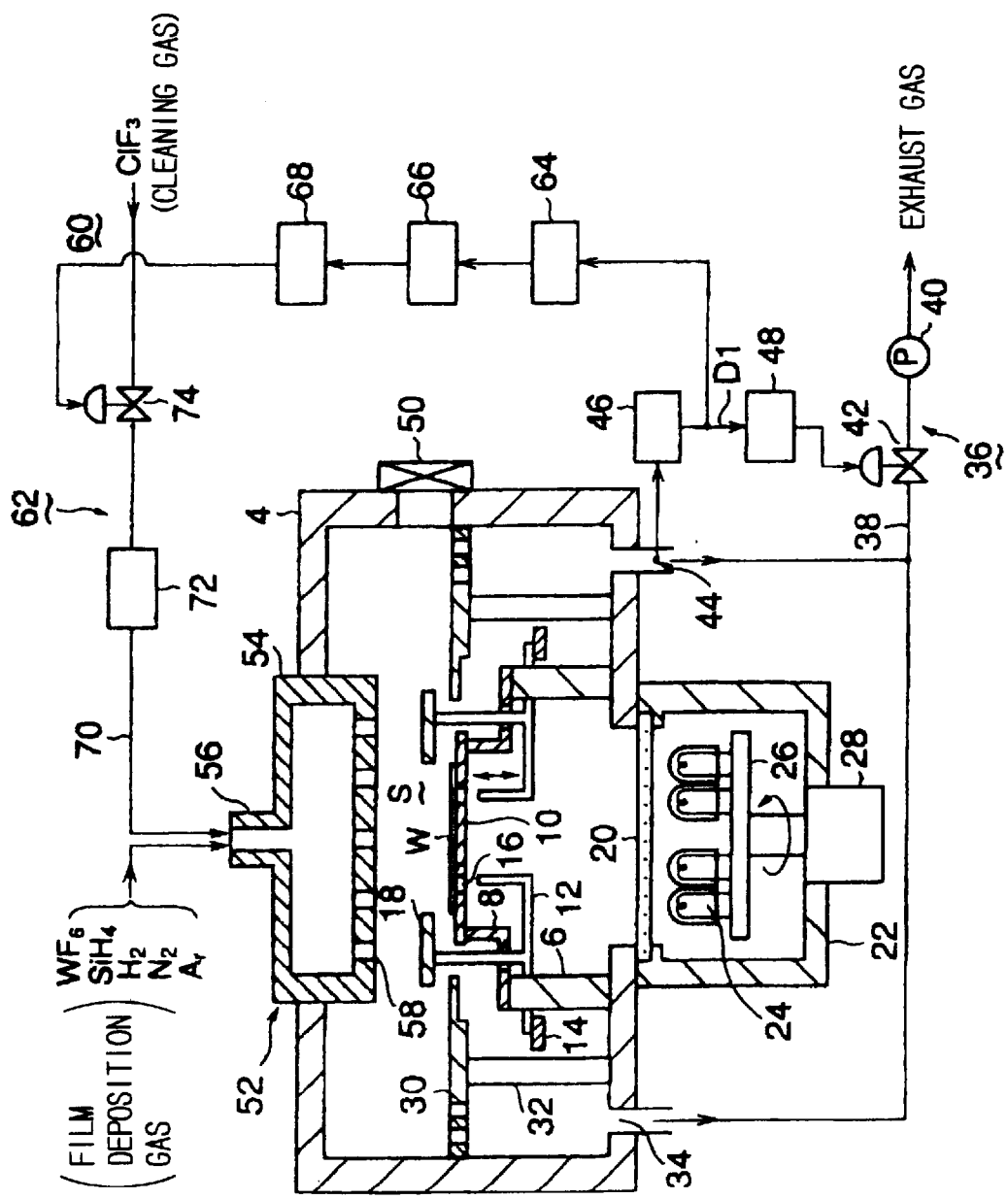
FIG. 1 is a structural view showing a cleaning apparatus of the present invention, which is juxtaposed with a film deposition apparatus.

FIG. 1 is a structural view showing the cleaning apparatus of the present invention, which is juxtaposed with the film deposition apparatus. This film deposition apparatus 2 includes a processing container 4 which is shaped so as to be a cylinder or box made of e.g. aluminum etc. In the processing container 4, a cylindrical reflector 6 is formed so as to stand from the bottom of the processing container 4. To mount a semiconductor wafer W as an object to be processed, a mounting table 10 is arranged on the reflector 6 through a holding member 8 having e.g. L-shaped cross section. For purposes of reflecting the light of a lamp, this reflector 6 is made of e.g. aluminum. On the other hand, for purposes of insulating the mounting table 10 from heat conduction, the holding member 8 is made of material exhibiting a low heat-conductivity, for example, quartz. Further, the mounting table 10 is made of material having a thickness of 1 mm, for example, carbon material, aluminum compound, such as AlN, etc.

Below the mounting table 10, there are arranged some, for example, three lifter pins 12 which stand on a supporting member 14 in the form of a circular ring upwardly, In operation, when a not-shown push rod that penetrates through the bottom of the processing container in an airtight manner allows the supporting member 14 to move up and down, the lifter pins 12 are inserted into lifter-pin holes 16 penetrating through the mounting table 10, allowing the wafer W to be lifted.

In order to press the periphery of the wafer W and successively fix it on the side of the mounting table 10, a ceramic clamp ring 18 is arranged in the circumference of the mounting table 10. For example, the clamp ring 18 is shaped so as to be a general ring following the contour of the wafer. This clamp ring 18 is adapted so as to move up and down in one body with the lifter pins 12.

Further, the processing container is provided, on its bottom part just below the mounting table 10, with a permeable window which is made of heat-rays permeable material, such as quartz. On contact with a sealing member, for example, O-ring, the permeable window 20 is secured on the bottom of the processing container airtightly. Under the permeable window 20, a box-shaped heating chamber 22 is provided so as to surround the window 20. In this heating chamber 22, a plurality of heating lamps 24 as heating means are mounted on a rotary table 26 also serving as a reflecting mirror. This rotary table 26 is rotated by a rotating motor 28. Thus, the heat rays emitted from the heating lamp 24 permeate through the permeable window 20 and successively irradiate the back face of the mounting table 10 to heat it.

On the circumferential side of the mounting table 10, a rectifying plate 30 in the form of a ring having a number of straightening holes is supported on a support column 32 shaped to be annular in the upward-and-downward direction. The container is provided, on its bottom part below the rectifying plate 30, with exhaust ports 34 to which a vacuum exhausting system 36 is connected. In detail, the vacuum exhausting system 36 has an exhaust passage 38 connected to the exhaust ports 34 and also including a vacuum pump 40 allowing the atmosphere inside the processing container 4 to be evacuated.

The exhaust passage 38 further includes an automatic pressure regulating valve 42 on the upstream side of the vacuum pump 40. The control of the automatic pressure regulating valve 42 is accomplished as follows. For example, a pressure sensor 44 for detecting a pressure in the processing container 4 is arranged at the exhaust port 34. A pressure value detected by the pressure sensor 44 is inputted to an opening degree controller 46, such as microcomputer. In the controller 46, it is executed to compare the detected pressure value with a predetermined process pressure and successively generate control signals (voltage) D1 to a valve actuator 48 so that a difference between the detected pressure value and the predetermined process pressure becomes zero. This valve actuator 48 controls an opening degree of the automatic pressure regulating valve 42 on the ground of the control signal D1, so that the interior of the processing container 4 can be maintained at a generally constant pressure. Further, the processing container 4 is provided, on its sidewall, with a gate valve 50 which opens and closes when loading and unloading the wafer with respect to the processing container 4.

On the ceiling part of the processing container opposing the mounting table 10, there is provided a shower head 52 as gas introducing means for introducing a processing gas etc. into the processing container 4. In detail, this shower head 52 has a head body 54 shaped to be a circular box and made of e.g. aluminum etc. The shower head 52 is provided, on its ceiling part, with a gas introducing port 56.

Introduced into the gas introducing port 56 via a gas passage is a gas necessary for the processing, namely, film deposition gas, for example, $WF_6$, Ar, $SiH_4$, $H_2$, $N_2$. In order to discharge the gas, which has been supplied into the head body 54, into a processing space S, a number of gas ejecting orifices 58 are formed substantially throughout the surface of the lower part of the head body 54, allowing the gas to be discharged over the surface of the wafer.

Provided to the so-constructed film deposition apparatus is a cleaning apparatus 60 that is characterized by the present invention. This cleaning apparatus 60 mainly comprises a cleaning-gas introducing unit 62 for introducing a cleaning gas into the shower head 52, a valve-opening monitoring unit 64 for monitoring an opening degree of the automatic pressure regulating valve 42, a change detecting unit 66 for detecting a change in the opening degree on the ground of outputs of the unit 64 and a cleaning-end recognizing unit 68 for recognizing an end point of the cleaning operation on the ground of outputs of the unit 66.

In detail, the cleaning-gas introducing unit 62 includes a cleaning gas passage 70 connected to the gas introducing port 56. Further, a flow control unit 72, such as mass flow controller, and a passage valve 74 are interposed in the cleaning gas passage 70. Hereat, ClF-type gas easily capable of its thermal resolution without a plasma, for example, $ClF_3$-gas is employed as the cleaning gas. Without monitoring a physical opening degree of the valve directly, the valve-opening monitoring unit 64 is constructed so as to monitor the opening degree indirectly by monitoring the control signals D1 transmitted from the opening degree controller 46 to the valve actuator 48. For instance, voltage values ranging from 1 (V) to 4 (V) in the control signals D1 correspond to a range from 0 degree (full-close) to 90 degrees (full-opening) in the opening degree of the valve. The change detecting unit 66 detects how much the opening degree (voltage) has changed from a reference value (reference voltage) for the opening degree. The cleaning-end recognizing unit 68 can recognize the end point of the cleaning operation on the ground of values detected by the change detecting unit 66. As described later, the end point of the cleaning operation may be provided by a point of time when it is detected that the opening degree of the valve has changed more than a predetermined amount. Alternatively, for the sequent over-etching, the end point may be provided by a point of time when a predetermined period has passed since the above point of time when the change in excess of the predetermined amount was detected.

Next, we describe the cleaning method performed by using the above-constructed apparatus.

When performing the normal film deposition process, it is firstly carried out to open the gate valve 50 on the sidewall of the processing container 4. Thereafter, the wafer W is loaded into the processing container 4 by a not-shown transfer arm and successively mounted on the mounting table 10.

Then, as the processing gas, a predetermined quantity of $WF_6$ (material gas) from a not-shown gas source and a predetermined quantity of necessary gas out of $SiH_4$, $H_2$, Ar and $N_2$ are respectively supplied to the shower head 52 for mixing them. Continuously, the mixture gas is supplied into the processing container 4 through the gas ejecting orifices 58 in the lower face of the head body 54 generally uniformly. Simultaneously, the inside atmosphere of the processing container 4 is sucked and exhausted through the exhaust ports 34 to establish a designated degree of vacuum, while the heating lamps 24 below the mounting table 10 are rotated and activated to radiate heat energy. Consequently, the wafer W mounted on the mounting table 10 is heated up to a designated temperature rapidly. During this heating, owing to the operation of the automatic pressure regulating valve 42, the pressure in the processing container 4 is maintained at a predetermined process pressure, as described above. In this way, the supplied mixture gas produces a designated chemical reaction, so that a film in accordance with the film deposition condition, for example, tungsten film is formed on the surface of the wafer.

Due to this film deposition process, since unnecessary films providing the origins of particles adheres to, not to mention the surface of the wafer, an inner wall of the processing container 4, a surface on the mounting table 10, a surface of the shower head 52, surfaces of not-shown attachments, etc., there is performed a cleaning process to remove the unnecessary film periodically or irregularly.

According to the present invention, at this cleaning process, the automatic pressure regulating valve 42 is operated to maintain the interior of the processing container 4 at a constant pressure.

Firstly, while allowing a cleaning gas with a fixed flow rate (e.g. 1000 sccm) to flow through the cleaning gas passage 70 of the cleaning-gas introducing unit 62, the heating lamps 24 are energized to maintain the interior of the processing container 4 at a designated temperature, for example, the order of 250° C. Simultaneously, the vacuum exhausting system 36 is also operated to evacuate the processing container 4 so that the inside pressure is maintained at a constant pressure, for example, the order of 4 Torr. This pressure-maintenance operation is accomplished since the pressure sensor 44 at the exhaust port 34 always detects the pressure in the processing container 4 and furthermore, on a basis of the so-detected value, the opening degree of the automatic pressure regulating valve 42 is real-timely adjusted by the control operation of the opening degree controller 46 and the valve actuator 48.

Here, an essential reaction at the cleaning operation is carried out as shown with the following formula 1.

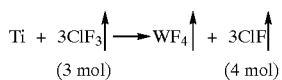

$$Ti + 3ClF_3\uparrow \longrightarrow WF_4\uparrow + 3ClF\uparrow \quad (1)$$
$$(3\ mol) \qquad\qquad (4\ mol)$$

That is, as the result of the reaction of $ClF_3$-gas of 3 mol. with tungsten designated by alphabet W, there is produced gas of approx. 4 mol. in total. In other words, the above reaction causes the volume of gas to be increased by only 1 mol., while the interior of the processing container 4 is maintained at a constant pressure, for example, 4 Torr. Now, if the unnecessary film (tungsten film in this case) is removed generally perfectly, then $ClF_3$-gas of 3 mol. is discharged without being reacted with tungsten. Thus, the removal of the unnecessary film causes the total volume of gas to be decreased by 1 mol., so that the opening degree of the automatic pressure regulating valve 42 somewhat reduces in order to maintain the pressure of 4 Torr. According to the present method, the end point of the cleaning operation is detected by detecting this change in opening degree of the automatic pressure regulating valve 42. In detail, during the cleaning operation, the opening-degree monitoring unit 64 monitors a voltage of the control signal D1 generated from the opening degree controller 46, periodically, for example, once every two seconds. While, the change detecting unit 66 detects a change between the monitored voltage and the reference voltage. For example, this control signal D1 represents 1 (V) when the valve is in the whole closed condition with its opening degree of zero. While, when the valve is in the whole opened condition, the control signal D1 represents 4 (V). Note, since the automatic pressure regulating valve is apt to be operatively unstable at the beginning of the cleaning operation, a voltage when the operation of the valve becomes stable, for example, a voltage when time of the order of five minutes has passed since the beginning of the cleaning operation is established as the reference voltage.

Then, in response to a situation that the above change (a change in the opening degree) becomes more than a predetermined value (e.g. 20 mV as the change in voltage), the cleaning-end recognizing unit 68 recognizes an end point of the cleaning operation and further closes the passage valve 74 to stop the supply of the cleaning gas. Here, the end point of the cleaning operation may be formed by a point of time when it is detected that the opening degree of the valve has changed over a predetermined amount. Alternatively, the end point may be formed by a point of time when a predetermined period (e.g. a period of the order of 10–30% of the whole cleaning period) has passed since the above change in the opening degree over the predetermined amount.

Figure 2:
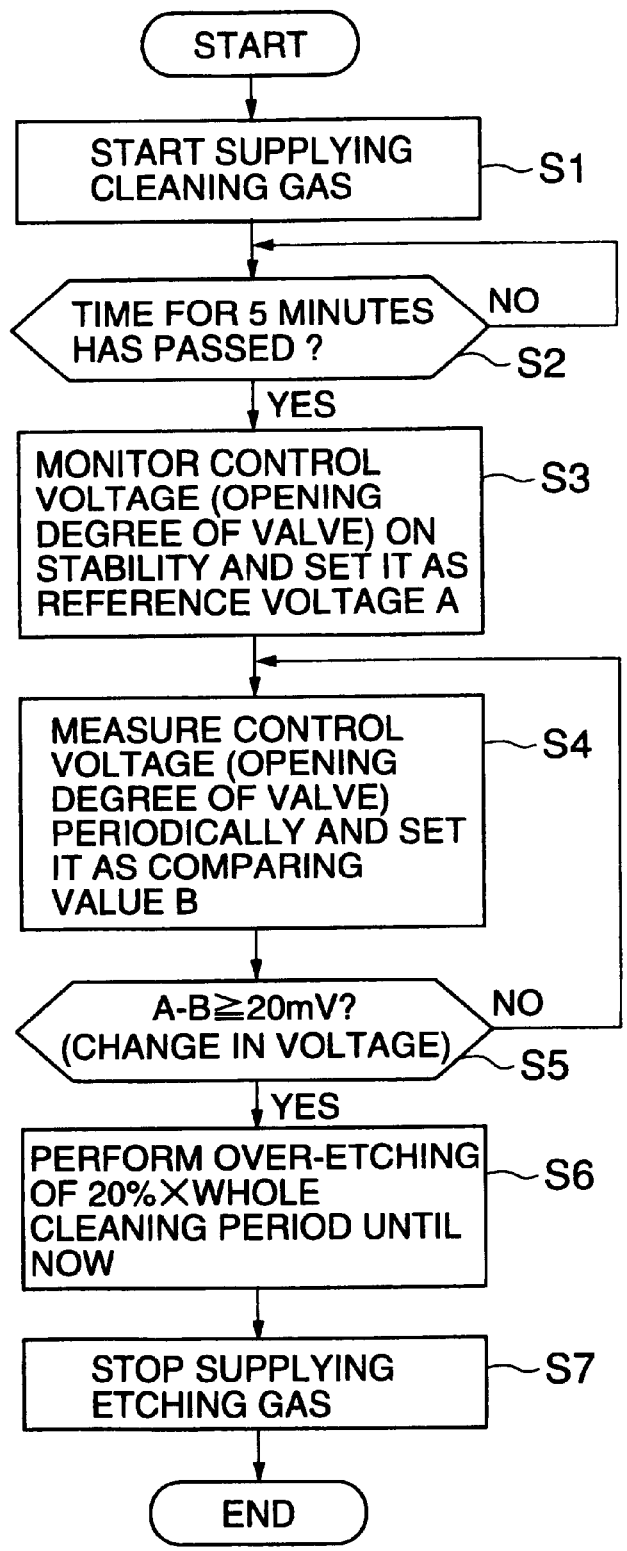
FIG. 2 is a flow chart showing steps of a cleaning method of the invention.

With reference to a flow chart of FIG. 2, we now provide one example of the above cleaning method. First of all, when the cleaning operation is started, then it is started to supply the cleaning gas of $ClF_3$ (step S1). In the initial stage of the cleaning operation, since the operation is apt to become unstable and an unstable adhering film is removed, the opening degree of the valve is not stabilized. Therefore, according to this embodiment, the period for stability of five minutes is estimated to stabilize the cleaning operation.

Then, when five minutes have passed since the supply of the cleaning gas (Yes at step S2), it is carried out to monitor the control voltage (opening degree of valve) D1 at this time and further establish the so-measured voltage as a reference voltage A (step S3).

Subsequently, it is executed to measure the control voltage D1 periodically, for example, with a ratio of the order of once two seconds and further establish the so-measured voltage as a comparison value B (step S4). Then, upon completion of calculating a difference between the reference voltage A and the comparison value B, it is judged whether the calculated change in the opening degree (change in voltage) becomes more than the predetermined value, for example, 20 mV in this embodiment (step S5). This operation is repeatedly carried out until the change in excess of the predetermined value is detected (NO at step S5). While, if the change in the opening degree becomes more than the predetermined value (YES at step S5), then an over-etching operation for a predetermined period is carried out to remove an unnecessary film more perfectly (step S6); otherwise that moment may coincide with the end point of the cleaning operation. This period for over-etching operation is established to be as long as e.g. 20% of a period required to execute the processes at steps S1 to S5, that is, 20% of the whole cleaning period up to the present. Thus, a point of time when the period for over-etching operation has elapsed is defined as the end point of the cleaning operation. In this way, when the over-etching operation of the predetermined period is completed to reach the end point of the cleaning operation (step S6), it is executed to stop the supply of the cleaning gas (step S7), thereby completing the etching process.

Figure 3:
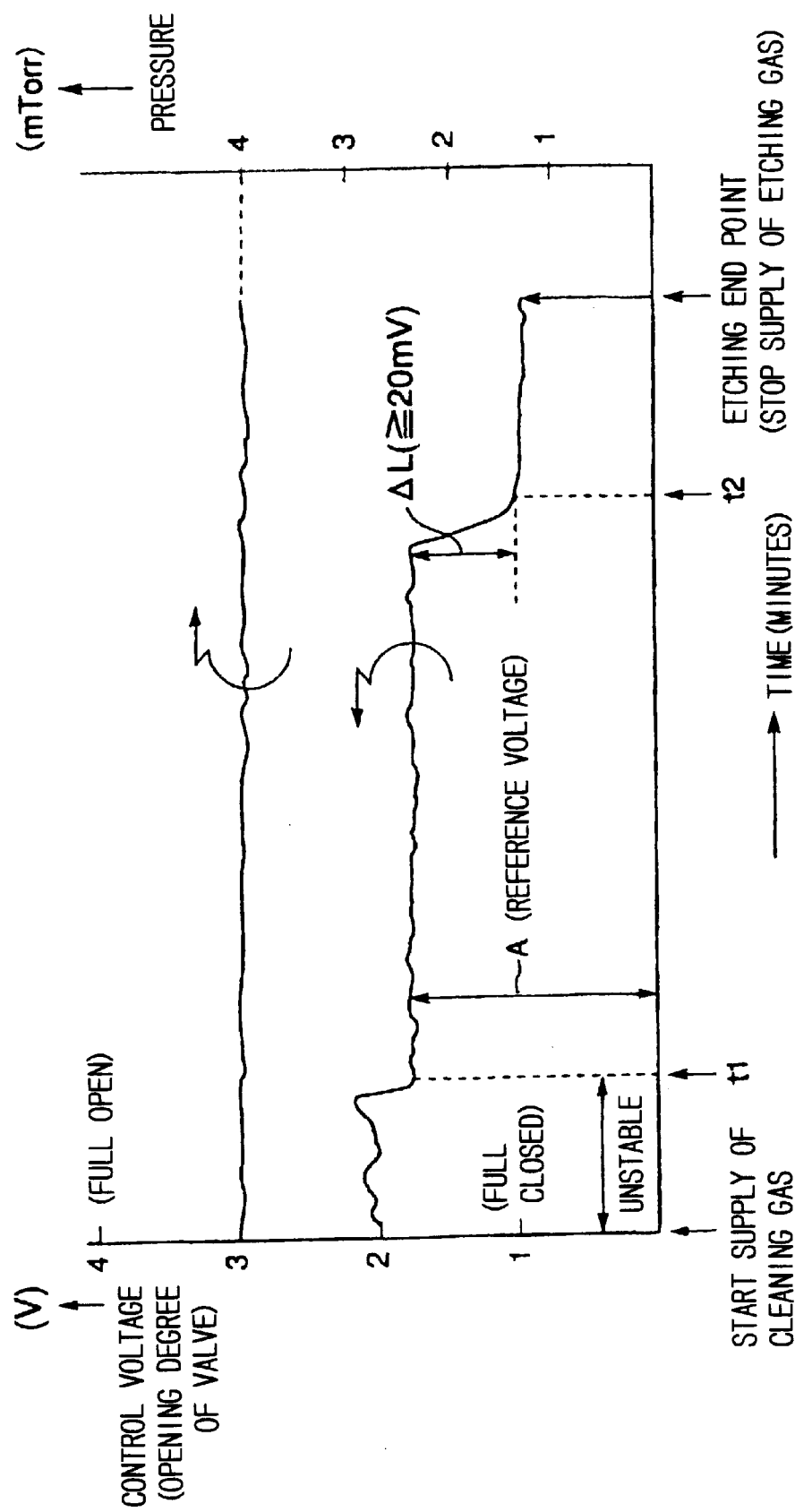
FIG. 3 is a graph showing a relationship between process pressure and voltage for control (opening degree of valve) during the cleaning operation.

FIG. 3 is a graph showing a relationship between the processing pressure and the control voltage (opening degree of the valve) during the cleaning operation. As shown in this graph, the processing pressure is maintained at e.g. 4 Torr throughout the whole period of the etching operation.

Till time t1 within five minutes since the start of supplying the etching gas, the opening degree of the valve is unstable and subsequently, it is stabilized. A value of control voltage in this stable condition is established as the reference voltage A. Thereafter, when a change ΔL in control voltage exceeds 20 (mV) at time t2, then it can be expected that an unnecessary adhering film has been substantially removed as of the present. Further in this embodiment, after completing the over-etching operation in the period of 20% of the whole cleaning period, the cleaning operation is ended. Consequently, the unnecessary film can be eliminated generally perfectly without causing an excessive over-etching.

The above-mentioned numerical example is nothing but one example of the application and therefore, it is a matter of course that the present invention is not limited to this example only. For instance, although the above-mentioned embodiment has a threshold value of 20 (mV) established for the change in voltage, this value should be established properly in consideration of the operative characteristics of the automatic pressure regulating valve 42, a variable amount of gas produced at the cleaning operation and so on. As occasion demands, the threshold value may be preset to be several mV.

Additionally, although the above-mentioned embodiment is described with an example of tungsten film as an objective film to be removed by the cleaning process, the present invention is not limited to this embodiment only and is applicable for removing other films of Ti, $W_2N$, TiN, $Ta_2O_5$, TaN.

For example, the reaction in case of removing Ti-film is as follows.

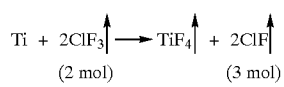
(2)

Thus, after the reaction, the amount of gas is increased by 1 mol.

Again, the reaction in case of removing $W_2N$-film is as follows.

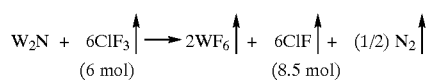
(3)

Thus, after the reaction, the amount of gas is increased by 2.5 mol.

The reaction in case of removing TiN-film is as follows.

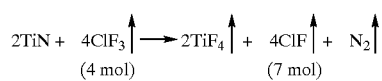
(4)

Thus, after the reaction, the amount of gas is increased by 3 mol.

The reaction in case of removing $Ta_2O_5$-film is as follows.

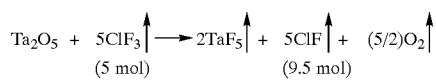
(5)

Thus, after the reaction, the amount of gas is increased by 4.5 mol.

The reaction in case of removing TaN-film is as follows.

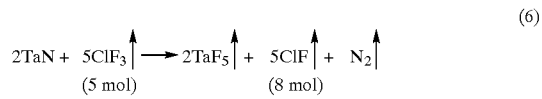
(6)

Thus, after the reaction, the amount of gas is increased by 3 mol.

As shown in the reaction formulas (2) to (6), the amounts of gas are respectively increased in all the reactions of removing the films of Ti, $W_2N$, TiN, $Ta_2O_5$, TaN. Accordingly, when the reaction is completed, the increase in the amount of gas is stopped, so that the automatic pressure regulating valve 42 is slightly reduced in its opening degree. Thus, as it is similar to the case of removing the tungsten film, it is possible to judge a point of time when the cleaning process is completed. Besides the above modifications, the present invention is applicable to the cleaning process for $WSi_2$-film, polysilicon film, etc. as well.

Although $ClF_3$ gas is employed as the cleaning gas, it is not limited to this embodiment. Besides this gas, there may be employed NF-type gas (e.g. $NF_3$ gas), HF-type gas (e.g. HF gas), etc. for the cleaning gas.

As to the film deposition apparatus, a resistance-heater type apparatus may be employed in place of the above-mentioned "lamp" heater type apparatus. Furthermore, not limited to the thermal cleaning process, the present invention is applicable to the plasma cleaning process using a plasma.

Although the present invention is described here by one example of a case that a quantity of gas resulting from the cleaning process increases, the invention is applicable to another case that the quantity decreases contrary. In short, the present invention will be applicable to any case so long as there exists a difference in the quantity of gas between during the cleaning process and after the cleaning process under a condition of flowing a constant amount of cleaning gas.

Additionally, the present invention is not limited to a film deposition apparatus for processing a semiconductor wafer as an object to be processed. Thus, the invention is also applicable to a film deposition apparatus for forming films on LCD substrates and glass substrates.

As mentioned above, according to the cleaning method and apparatus for the film deposition apparatus of the invention, it is possible to exhibit the following superior operations and effects.

According to the present invention, the cleaning process is performed so that the automatic pressure regulating valve allows the pressure inside the processing container to be usually fixed. Therefore, when an unnecessary film to be removed by the cleaning operation disappears, a quantity of gas due to the resolving reaction decreases to produce a tendency to reduce the pressure inside the processing container as much. Consequently, the opening degree of the automatic pressure regulating valve gets smaller in order to cancel the above tendency, so that the pressure inside the processing container is maintained at a generally constant value.

Accordingly, by monitoring the opening degree of the valve, is possible to recognize the end point of the etching operation when it is detected that the opening degree is reduced more than a predetermined amount.

To the contrary, even when a quantity of gas generated after the cleaning process decreases, it is possible to recognize the end point of the etching operation appropriately.

Furthermore, since the general film deposition apparatus is usually provided with an automatic pressure regulating valve, the film deposition apparatus of the present invention does not require a additional automatic pressure regulating valve but an existing valve.

What is claimed is:

1. A thermal cleaning method of a film deposition apparatus, for eliminating an unnecessary film adhering to the interior of a processing container of the film deposition apparatus by using a cleaning gas, the processing container forming a vacuum therein by a vacuum exhausting system, the method comprising the steps of:

introducing a predetermined quantity of cleaning gas into the processing container and simultaneously controlling an opening degree of an automatic pressure regulating valve provided in the vacuum exhausting system so as to maintain the interior of the processing container at a predetermined pressure;

monitoring a control signal corresponding to the opening degree;

establishing a reference value corresponding to a stable condition of the opening degree;

comparing the control signal to the reference value to calculate a change in the control signal;

comparing a calculated change in the control signal with a predetermined value; and recognizing an end point of an etching process.

2. The thermal cleaning method of the film deposition apparatus as claimed in claim 1, wherein the end point of the etching is detected at a point in time when it is detected that the change in the control signal has exceeded the predetermined value.

3. The thermal cleaning method of the film deposition apparatus as claimed in claim 1, wherein the end point of the etching is detected at a point in time when a predetermined period has passed since the control signal exceeded the predetermined value.

4. The thermal cleaning method of the film deposition apparatus as claimed in claim 3, wherein the predetermined period is within a range from 10% to 30% of a period from a start point of the etching until the point of time when it is detected that the change has exceeded the predetermined value.

5. The thermal cleaning method of the film deposition apparatus as claimed in any one of claims 1 to 4, wherein the control signal is a control voltage for driving the automatic pressure regulating valve.

6. The thermal cleaning method of the film deposition apparatus as claimed in any one of claims 1 to 4, wherein the cleaning gas is ClF-gas.

7. A thermal cleaning apparatus of a film deposition apparatus, comprising:

a processing container in which a mounting table for mounting an object to be processed thereon is accommodated;

a cleaning-gas supplying means for supplying a cleaning gas into the processing container;

a vacuum exhausting system for exhausting an atmosphere in the processing container to provide a vacuum;

an automatic pressure regulating valve interposed in the vacuum exhausting system so that pressure in the processing container can be maintained at a constant pressure by changing an opening degree of the automatic pressure regulating valve;

a valve-opening monitoring means for monitoring the opening degree of the automatic pressure regulating valve;

a change detecting means for detecting a change in the opening degree from an opening degree corresponding to a stable condition on a basis of an output from the valve-opening monitoring means; and a cleaning-end-point recognizing means for recognizing an end point of a cleaning operation when the opening degree has changed by more than a predetermined amount on a basis of an output from the change detecting means.

8. A thermal cleaning apparatus of a film deposition apparatus, comprising:

a processing container in which a mounting table for mounting an object to be processed thereon is accommodated;

a cleaning-gas supplying means for supplying a cleaning gas into the processing container;

a vacuum exhausting system for exhausting an atmosphere in the processing container to provide a vacuum;

an automatic pressure regulating valve interposed in the vacuum exhausting system so that pressure in the processing container can be mantained at a constant pressure by changing an opening degree of the automatic regulating valve;

a valve-opening monitoring means for monitoring the opening degree of the automatic pressure regulating valve;

a change detecting means for detecting a change in the opening degree from an opening degree corresponding to a stable condition on a basis of an output from the valve-opening monitoring means; and a cleaning-end-point recognizing means for recognizing an end point of a cleaning operation when a predetermined period has passed since the opening degree changed by more than a predetermined amount on a basis of an output from the change detecting means.

9. A thermal cleaning apparatus according to claim 7 or 8, wherein the valve-opening monitoring means monitors a control voltage for driving the automatic pressure regulating valve.

* * * * *